(12) United States Patent
Hikmet et al.

(10) Patent No.: US 9,755,117 B2
(45) Date of Patent: Sep. 5, 2017

(54) PHOSPHOR-ENHANCED LIGHTING DEVICE, RETROFIT LIGHT BULB AND LIGHT TUBE WITH REDUCED COLOR APPEARANCE

(75) Inventors: Rifat Ata Mustafa Hikmet, Eindhoven (NL); Ties Van Bommel, Horst (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/114,930

(22) PCT Filed: Apr. 17, 2012

(86) PCT No.: PCT/IB2012/051918
§ 371 (c)(1),
(2), (4) Date: Oct. 31, 2013

(87) PCT Pub. No.: WO2012/153212
PCT Pub. Date: Nov. 15, 2012

(65) Prior Publication Data
US 2014/0077247 A1   Mar. 20, 2014

(30) Foreign Application Priority Data

May 6, 2011   (EP) ...................................... 11165112

(51) Int. Cl.
*H01L 33/50* (2010.01)
*H01L 33/60* (2010.01)

(52) U.S. Cl.
CPC .......... *H01L 33/504* (2013.01); *H01L 33/507* (2013.01)

(58) Field of Classification Search
CPC ....... H01L 33/50; H01L 33/504; H01L 33/60; H01L 33/00; H01L 33/505; H01L 33/507;
(Continued)

(56) References Cited

U.S. PATENT DOCUMENTS 7,884,382 B2  2/2011 Setlur et al.
2005/0093001 A1*  5/2005 Liu et al. ................. 257/79
(Continued)

FOREIGN PATENT DOCUMENTS

CN   101262032 A   9/2008
NL   WO 2008126038   * 10/2008   ....... G02F 1/133603
WO   2010116294 A1   10/2010

OTHER PUBLICATIONS

Lin et al., machine translaton of CN101262032 (A), 2008, pp. 1-7.*

*Primary Examiner* — Natalia Gondarenko

(57) ABSTRACT

A phosphor-enhanced lighting device 100, a retrofit light bulb, a light tube and a luminaire are provided. The phosphor-enhanced lighting 100 device comprises a light source 116, a light exit window 102, a first light conversion element 112 and a second light conversion element 110. The light source 116 emits through its light emitting surface 118 source light 114 of a pre-defined color spectrum. The light exit window 102 emits light into an ambient of the phosphor-enhanced lighting device 100. The first light conversion element 112 comprises an inorganic luminescent material which absorbs a part of the source light 114 and converts a part of the absorbed light to light of a first color 104. The second light conversion element 110 comprises a first organic luminescent material which absorbs a part of the source light 114 and/or absorbs apart of the light 104 of the first color. The first organic luminescent material converts a part of the absorbed light to light of the second color 108. The second light conversion element 110 is optically arranged in between the light exit window 102 and the light emitting surface 118 of the light source 116. The first light conversion element 112 is optically arranged in between the second light conversion element 110 and the light emitting surface 118 of the light source 116. A gap 111 is present between the first light conversion element 112 and the second light conversion element 110.

15 Claims, 6 Drawing Sheets

(58) Field of Classification Search
CPC .......... H01L 33/48–33/648; H01L 2933/0033; H01L 2933/005; H01L 2933/0066–2933/0091
USPC ............... 257/98, 99, 89, E33.061, E33.072, 257/E33.074, E33.056, E33.059, E33.067, 257/E33.068; 438/27, 29; 313/504; 362/230; 428/690
See application file for complete search history.

(56) References Cited

U.S. PATENT DOCUMENTS

| | | |
|---|---|---|
| 2006/0214578 A1 | 9/2006 | Iwanaga et al. |
| 2006/0220531 A1 | 10/2006 | Tokunaga et al. |
| 2007/0063214 A1 | 3/2007 | Kim et al. |
| 2008/0128735 A1 | 6/2008 | Yoo et al. |
| 2008/0180948 A1* | 7/2008 | Yoon ........................... 362/230 |
| 2008/0210961 A1* | 9/2008 | Lin ....................... H01L 33/508 257/98 |
| 2008/0211386 A1 | 9/2008 | Choi et al. |
| 2009/0173957 A1* | 7/2009 | Brunner ........................ 257/98 |
| 2009/0236621 A1* | 9/2009 | Chakraborty .................. 257/95 |
| 2010/0025700 A1* | 2/2010 | Jung .................. H01L 25/0753 257/89 |
| 2010/0142182 A1* | 6/2010 | Van Woudenberg ........... 362/84 |
| 2010/0163898 A1* | 7/2010 | Hung et al. ..................... 257/98 |
| 2011/0001148 A1* | 1/2011 | Sun et al. ....................... 257/88 |
| 2011/0006668 A1* | 1/2011 | Hussell ................. H01L 33/501 313/499 |
| 2012/0025216 A1* | 2/2012 | Kolodin et al. ................ 257/88 |
| 2012/0098000 A1* | 4/2012 | Tsang ............................ 257/98 |
| 2014/0021857 A1* | 1/2014 | Van Bommel et al. ...... 313/504 |

* cited by examiner

PHOSPHOR-ENHANCED LIGHTING DEVICE, RETROFIT LIGHT BULB AND LIGHT TUBE WITH REDUCED COLOR APPEARANCE

FIELD OF THE INVENTION

The invention relates to phosphor-enhanced lighting devices comprising an organic luminescent material.

BACKGROUND OF THE INVENTION

Published patent application WO2010/116294 discloses embodiments of phosphor-enhanced light source wherein a stack with a layer with an inorganic luminescent material and with a layer with an organic luminescent material are arranged in a so-termed direct phosphor configuration or in a so-termed remote phosphor configuration. In a direct phosphor configuration the stack of layers with the different luminescent materials is applied directly on top of a light emitting surface of a light source. In a remote phosphor configuration there is a gap between the light emitting surface of the light source and the stack of layers with luminescent material, in other words, the stack of layers with luminescent material is arranged at a specific distance away from the light source.

The stack of luminescent of layers of the embodiments of the cited patent application have the layer with the organic luminescent material arranged at a side of the stack of layers at which the viewer looks towards the phosphor-enhanced light source. The layer with the inorganic luminescent material is arranged at a side of the stack of layers that is closest to the light emitting surface of the light source. The layer with organic luminescent material is often relatively transparent because the organic luminescent molecules are intrinsically transparent. A viewer does not see a color in the layer with organic luminescent material. However, inorganic luminescent particles in the layer with inorganic luminescent material act as a scattering material and reflect light in all directions. Thus, if light from the ambient impinges on the luminescent material, some light in the absorption spectrum of the inorganic luminescent material is absorbed, and the non-absorbed light is reflected and/or scattered, which, consequently, has a color that is a complement color of the color of the absorption spectrum of the inorganic luminescent material. This complement color is seen by a viewer who looks towards the stack of luminescent layers. This is termed "a color appearance", which means that the layer appears to have a specific color. In many applications it is undesired to have the color appearance because it seems for the viewer that a phosphor-enhanced light source has the specific color of the light that is generated by the inorganic luminescent material. For example, if a specific inorganic luminescent material has an absorption spectrum in the blue color range, the color appearance of the specific organic luminescent material will be orange/yellow.

Further, the light sources of the cited patent application have to emit light with a correlated color temperature typically in a range of 2700 to 6000 Kelvin, and typically have a blue emitting Light Emitting Diode (LED). To obtain this correlated color temperature, a relatively large amount of blue light has to be converted to light of a longer wavelength. The conversion of blue light to light of a longer wavelength is performed by the inorganic luminescent material, and thus a relatively large amount of inorganic luminescent material needs to be used, which results in a stronger color appearance.

It is to be noted that it is known that organic luminescent material may be used instead of inorganic luminescent material. However, in order to obtain a high enough color rending index it may be necessary to use a combination of an organic luminescent material and an inorganic luminescent material.

SUMMARY OF THE INVENTION

It is an object of the invention to provide a phosphor-enhanced lighting device having a reduced color appearance.

A first aspect of the invention provides phosphor-enhanced lighting device as claimed in claim 1. A second aspect of the invention and a third aspect of the invention provide a retrofit light bulb and a light tube, respectively, as claimed in claim 14. A fourth aspect of the invention provides a luminaire as claimed in claim 15. Advantageous embodiments are defined in the dependent claims.

A phosphor-enhanced lighting device in accordance with the first aspect of the invention comprises a light source, a light exit window, a first light conversion element and a second light conversion element. The light source emits through its light emitting surface source light of a predefined color spectrum. The light exit window emits, in operation, light into an ambient of the phosphor-enhanced lighting device. The first light conversion element comprises an inorganic luminescent material. The inorganic luminescent material absorbs a part of the source light and converts a part of the absorbed light to light of a first color. The second light conversion element comprises a first organic luminescent material. The first organic luminescent material absorbs a part of the source light and/or absorbs a part of the light of the first color. The first organic luminescent material converts a part of the absorbed light to light of the second color. The second light conversion element is optically arranged in between the light exit window and the light emitting surface of the light source. The first light conversion element is optically arranged in between the second light conversion element and the light emitting surface of the light source. A gap is present between the first light conversion element and the second light conversion element.

The inventors have found that, if the gap is present between the first light conversion element and the second light conversion element such that the first light conversion element is arranged at a larger distance from the light exit window than the second light conversion element, the color appearance reduces. The effect of the gap is that less light is received by the first light conversion element compared to the configuration of a first light conversion element that is in direct contact with the second light conversion element. Consequently, less light is absorbed by the inorganic luminescent material and the color appearance reduces. An interface between the second light conversion element and the gap reflects light that impinges at relatively large angles with respect to the normal to the light exit window, and thus less light is received by the first light conversion element.

The presence of the gap between the first light conversion element and the second light conversion element means that the first light conversion element and the second light conversion element are not in direct contact. Another light transmitting material, such as air or water, may be in between the first light conversion element and the second light conversion element, however, in other embodiment the gap may be a vacuum.

It is to be noted that the color appearance mainly relates to situations wherein the light source is not in operation, meaning that the light source is not emitting light of the predefined color distribution, and may relate to a lesser extent to situations wherein the light of the ambient has a much higher intensity than the light emitted by the light source. If the light source of the phosphor-enhanced lighting device is emitting light, the person who looks towards the phosphor-enhanced lighting device sees a light emission of a color for which the phosphor-enhanced lighting device is specifically designed. The experienced color of the light emission by the phosphor-enhanced lighting device is, in operation, a specific combination of light of the predefined color distribution emitted by the light source, light of the first color emitted by the first conversion element and light of the second color emitted by the second light conversion element. However, if ambient light which impinges on the phosphor-enhanced lighting device is much more intense than the light emitted by the light source, for example, in a situation wherein direct sunlight impinges on the phosphor-enhanced lighting device, the reflection of the direct sunlight by the inorganic luminescent material may become dominantly, and, thus, the viewer sees the color appearance of the inorganic luminescent material.

It is further to be noted that the meaning of "optically arranged in between" is that the specific element that is arranged in between a first element and a second element is arranged in an optical path from the first element to the second element and vice versa. Such an optical path is not by definition following a straight line from the first element to the second element, but the optical path may have corners because of mirrors at the optical path.

In the context of the invention, light of a predefined color distribution, light of the first color and/or light of the second color typically comprises light having a predefined spectrum. The predefined spectrum may, for example, comprise a primary color having a specific bandwidth around a predefined wavelength, or may, for example, comprise a plurality of primary colors. The predefined wavelength is a mean wavelength of a radiant power spectral distribution. The light of a primary color, for example, includes Red, Green, Blue, Yellow and Amber light. Light of the predefined color distribution, the first color and/or the second color may also comprise mixtures of primary colors, such as Blue and Amber, or Blue, Yellow and Red.

In an embodiment, the first light conversion element has a first surface on which ambient light impinges if ambient light impinges on the light exit window. The second light conversion element has a second surface on which ambient light impinges if ambient light impinges on the light exit window. The first surface is smaller than the second surface. If the first light conversion element is located closer to the light source, a cross-section of a light beam emitted by the light source is smaller than a cross-section of the light beam at the position of the second light conversion element. Thus, the first light conversion element may be having a smaller size than the second light conversion element. Thus, the first surface of the first light conversion element is smaller than the second surface of the second light conversion element. Having a smaller first surface means that less ambient light is absorbed, and thus that the color appearance is reduced.

In a further embodiment, the first light conversion element is arranged in the vicinity of the light source. In the vicinity of the light source means that the distance, along an optical path, between the light source and the first light conversion element is much smaller than the distance, along the optical path, between the light source and the second light conversion element. For example, the distance from the light source to the first light conversion element is less than 20% of the distance from the light source to the second light conversion element along the optical path from the light source to the light exit window. If the first light conversion element is in the vicinity of the light source, its size may be relatively small and as such its surface on which light from the ambient may impinge is relatively small such that the color appearance is less dominantly visible.

In an embodiment, the first light conversion element is arranged on the light emitting surface of the light source.

In another embodiment, the first light conversion element covers the complete light emitting surface of the light source.

The light emitting surface of the light source is often much smaller than the light exit window and as such the first light conversion element may have a relatively small size, while still the whole light beam generated by the light source is transmitted through the first light emitting element. Having a relatively small size is advantageous because less light of the ambient light is absorbed by the first light conversion element and as such the color appearance of the phosphor-enhanced lighting device is reduced.

In a further embodiment, the light source is a light emitting diode that emits blue light. The inorganic luminescent material is a yellow or yellow-green emitting inorganic phosphor. A light emission that is, in operation, a combination of light emitted by the light source and the light of the first color generated by the first light conversion element has a correlated color temperature that is higher than 10000 Kelvin and has a color point in a color space close to or on a black body line in the color space. The black body line is a sequence of color points in the color space which corresponds to the light emission of an idealized black bodies which have a specific temperature. The color temperature is the temperature of the idealized black body. If the correlated color temperature of the emitted light is more than 10000 Kelvin and the color point is close to the black body line, humans experience the color of the emitted light as white or slightly bluish. It is relatively easy to arrange the first light conversion element, which comprises a yellow or yellow-green emitting inorganic luminescent material (phosphor), on a light emitting diode, which emits blue light, such that the combined light emission of the light source and of the first light conversion element has a correlated color temperature that is higher than 10000 Kelvin and has a color point close to the blackbody line. Blue emitting light emitting diodes are available at relatively low prices. Further, the first light conversion element has to comprise a relatively small amount of yellow or yellow-green emitting inorganic phosphors such that the price of the first light conversion element is relatively low as well. Further, the use of a relatively small amount of inorganic phosphors leads to a reduction of color appearance.

In another embodiment, a combination of the light source with the light emitting surface on which the first light conversion element is arranged has an optical package efficiency that is larger than 80%.

The optical package efficiency is defined as the percentage of an amount of photons that is emitted by the light source that the amount of photons that is emitted into the ambient of the combination of the light source and the first light conversion element. Further, the optical package efficiency has to be corrected for the quantum efficiency of the inorganic luminescent material by diving the above discussed percentage by the quantum efficiency of the inorganic luminescent material. The quantum efficiency of the inorganic luminescent material is defined as the ratio between the amount of photons that is emitted by the inorganic luminescent material and the amount of photons absorbed by the inorganic luminescent material. The term 'package' refers to the combination of the light source and the first light conversion element.

The first light conversion element may reflect some light, which it receives from the light source, back to the light source. Further, some light generated by the first light conversion element may be emitted into the direction of the light source. Many light sources, such as, for example, solid state light emitters, absorb a relatively large portion of the light that impinges on them. The absorption of light results in a lower optical package efficiency. It is advantageous to have a relatively high optical efficiency because less power is required to generate a specific amount of light, and the temperature of the light source is not increased because of the result of the absorption of the light.

The characteristics of the inorganic luminescent material of the first light conversion element (for example the absorption spectrum and the light emission spectrum), the scattering and reflection characteristics of the first light conversion element as a whole and, for example, the thickness of the first light conversion element determine the optical package efficiency of the combination of the light source and the first light conversion element. Further characteristics of the light source influence the optical package efficiency as well, such as, for example, an absorption coefficient of the light source.

In a further embodiment, the optical package efficiency of the combination of the light source and the first light conversion element is larger than 90%.

In another embodiment, the second light conversion element has a second refractive index. A material that forms the gap has a first refractive index that is smaller than the second refractive index.

Thus, an interface from the second light conversion element and the gap partly reflects light that is transmitted in a direction from the second light conversion element towards the gap. The light transmitted in this direction may be ambient light that impinges on the light exit window of the phosphor-enhanced lighting device. Especially, if the ambient light is relatively diffuse, light impinges at all angles at the light exit window, and as such also at a plurality of angles at the interface between the second light conversion element and the gap. The light which impinges at relatively large angles with respect to the normal of this interface will be subject to internal reflection. Thus, less light from the ambient, which impinges on the light exit window of the phosphor-enhanced lighting device, is transmitted towards the first light conversion element, and as such the color appearance of the first light conversion element is limited.

In an embodiment, the gap is filled with a fluid. An example of a fluid is a gas such as air, or a liquid, such as water.

In an embodiment, the second light conversion element is arranged at the light exit window.

In a further embodiment, the second light conversion element forms the light exit window.

In another embodiment, the light source is a solid state light emitter. It is beneficial to use solid state light emitters because they are relatively efficient (convert a large amount of electrical energy towards light), are relatively small in size, and are relatively cheap. The solid state light emitter may be a Light Emitting Diode (LED), an Organic Light Emitting Diode (OLED), Polymer Light Emitting Diode (PLED) or a laser diode. In practical embodiments, the solid state light emitter emits blue light.

In an embodiment, at least one of the first light conversion element and the second light conversion element is a layer. A layer is defined by the property that a thickness of the layer is at least two times smaller than the width or the depth of the layer. Thus, the term 'layer' may also be interpreted as 'coating', 'film' or 'tile'. Layers are relatively easy to manufacture and as such the costs of the phosphor-enhanced lighting device may be reduced by using layers that comprise a specific luminescent material. It is further to be noticed that a layer is not necessarily following a flat plane. A layer may also have the shape of a curved plane, or the shape of a hemisphere.

In an embodiment, the second light conversion element comprises a second organic luminescent material. The second organic luminescent material is configured to absorb a part of the source light and/or to absorb a part of the light of the first color and/or to absorb a part of the light of the second color. The second organic luminescent material is further configured to convert a part of the absorbed light to light of a third color. The use of an additional organic luminescent material provides an additional design parameter for obtaining a phosphor-enhanced lighting device which has a specific light emission distribution. The light generated by the second organic luminescent material may be used to shift the color of the light emission by the phosphor-enhanced lighting device to a specific color point in a color space and to obtain a higher color rendering index.

In another embodiment, the second light conversion element is a stack of layers that comprises a first layer and a second layer. The first layer comprises the first organic luminescent material and does not comprise the second organic luminescent material. The second layer comprises the second organic luminescent material and does not comprise the first organic luminescent material. Thus, the second light conversion element comprises layers which each comprise only a single (organic) luminescent material. It is advantageous to manufacture the second light conversion element in a stack of separate layers because such a structure may be manufactured accurately and relatively cheap. It is to be noted that in other embodiments the first organic luminescent material and the second organic luminescent material may be mixed and provided in a singles layer.

In an embodiment, the phosphor-enhanced lighting device comprises a scattering layer and the scattering layer is optically arranged in between the light exit window and the second light conversion element. In another embodiment, the second light conversion element comprises scattering particles. The scattering layer or the scattering particles scatter light that impinges from the ambient, and prevent that much light from the ambient is transmitted towards the first light conversion element. Thus, the color appearance is reduced by the scattering particles or the scattering layer. A person who looks towards the light exit window at the moment that the light source is not in operation mainly sees ambient light that is scattered and reflected by the scattering particles or the scattering layer.

In accordance with a second aspect of the invention, a retrofit light bulb is provided which comprises the phosphor-enhanced lighting device according to the first aspect of the invention.

In accordance with a third aspect of the invention, a light tube is provided which comprises the phosphor-enhanced lighting device according to the first aspect of the invention.

In according to a fourth aspect of the invention, a luminaire is provided which comprises the phosphor-enhanced lighting device according to the first aspect of the invention, or which comprises the retrofit light bulb according to the second aspect of the invention, or which comprises the light tube according to the third aspect of the invention.

The retrofit light bulb, the light tube and the luminaire provide the same benefits as the phosphor-enhanced lighting device according to the first aspect of the invention and have similar embodiments with similar effects as the corresponding embodiments of the phosphor-enhanced lighting device.

These and other aspects of the invention are apparent from and will be elucidated with reference to the embodiments described hereinafter.

It will be appreciated by those skilled in the art that two or more of the above-mentioned embodiments, implementations, and/or aspects of the invention may be combined in any way deemed useful.

Modifications and variations of the retrofit light bulb, the light tube and the luminaire, which correspond to the described modifications and variations of the phosphor-enhanced lighting device, can be carried out by a person skilled in the art on the basis of the present description.

Figure 1A:
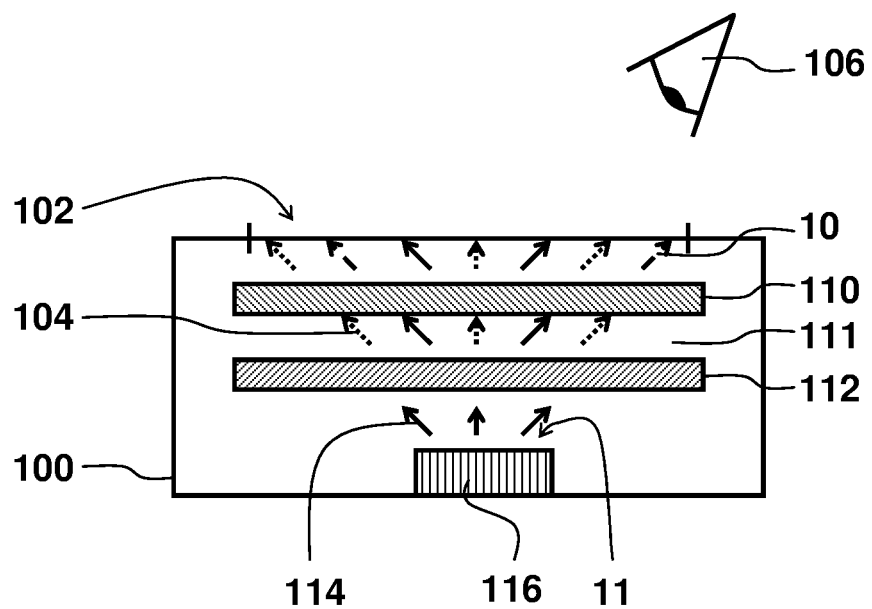
FIG. 1a schematically shows a cross-section of a first embodiment of a phosphor-enhanced lighting device in operation according to the first aspect of the invention, FIG. 1b schematically shows a cross-section of the first embodiment not in operation, FIGS. 2a and 2b schematically show a cross-section of a second and a third embodiment of a phosphor-enhanced lighting device, FIGS. 3a and 3b schematically show a cross-section of embodiments of the phosphor-enhanced lighting device with a non-straight optical path, FIGS. 4a, 4b and 4c schematically show a cross-section of a fourth, fifth and sixth embodiment of a phosphor-enhanced lighting device, FIG. 5a and 5b schematically show a cross-section of a seventh and eighth embodiment of a phosphor-enhanced lighting device, FIG. 6a schematically shows two cross-sections of embodiments of retrofit light bulbs according to the second aspect of the invention, FIG. 6b schematically shows two cross-sections of embodiment of light tubes according to the third aspect of the invention, and FIG. 6c schematically shows a luminaire according to a fourth aspect of the invention.

It should be noted that items denoted by the same reference numerals in different Figures have the same structural features and the same functions, or are the same signals. Where the function and/or structure of such an item have been explained, there is no necessity for repeated explanation thereof in the detailed description.

The figures are purely diagrammatic and not drawn to scale. Particularly for clarity, some dimensions are exaggerated strongly.

DETAILED DESCRIPTION

Figure 1B:
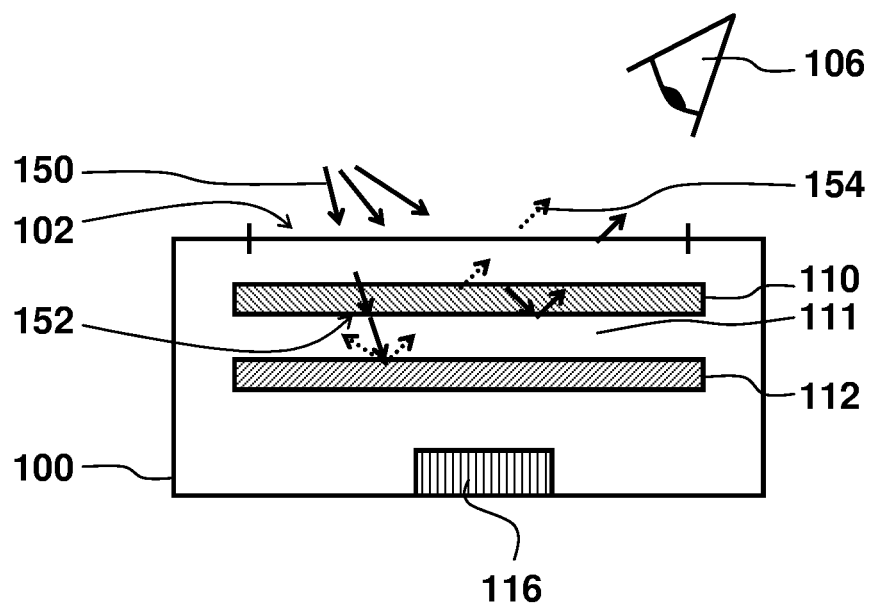

A cross-section of a first embodiment of a phosphor-enhanced lighting device 100 is shown in FIGS. 1a and 1b. FIG. 1a schematically shows the phosphor-enhanced lighting device 100 when the light source 116 is operating. FIG. 1b schematically shows the phosphor-enhanced lighting device 100 when the light source 116 is not operating.

The phosphor-enhanced lighting device 100 has a light exit window 102 through which light is emitted by the phosphor-enhanced lighting device 100. In the ambient of the phosphor-enhanced lighting device 100 is schematically drawn a viewer 106 who looks towards the light exit window 102 of the phosphor-enhanced lighting device 100. The phosphor-enhanced lighting device 100 further comprises a light source 116 which emits, in operation, light 114 of a predefined color distribution through its light emitting surface 118, which is, in the embodiment of FIG. 1a, the top surface of the light source 116.

The phosphor-enhanced lighting device 100 further comprises a first light conversion element 112 and a second light conversion element 110. The first light conversion element 112 comprises an inorganic luminescent material that absorbs a part of the light 114 emitted by the light source and converts a part of the absorbed light into light 104 of a first color. The second light conversion element comprises a first organic luminescent material. The first organic material absorbs light 114 emitted by the light source and/or absorbs light 104 emitted by the first light conversion element. The first organic material converts the absorbed light into light 108 of a second color.

The second light conversion element 110 is arranged in between the light exit window 102 and the light source 116. The first light conversion element 112 is arranged in between the second light conversion element 110 and the light source 116. In between the first light conversion element 112 and the second light conversion element 110 is a gap 111, which means that the first light conversion element 112 is not in direct contact with the second light conversion element 110. Another material is present between the first light conversion element 112 and the second light conversion element 110.

Thus, if the light source 116 is in operation, the light 114 of the predefined color distribution is first transmitted through the first light conversion element 112 and a portion of the light is converted to light 104 of the first color. Subsequently the second light conversion element 110 receives the light 104 of the first color and the light 114 of the predefined color distribution and converts a portion of the light towards light 108 of the second color. The light emission through the light exit window 102 is a specific combination of light 114 of the predefined color distribution, light 104 of the first color and light 108 of the second color. This combination of light 104, 108, 114 is experienced by the viewer 106 as a specific color, in other words, the light emission though the light exit window 102 may be represented by a specific color point in a color space, for example, in the CIE xyz color space. The specific amounts of luminescent material used in the conversion elements, the characteristics of the used luminescent materials and the characteristics of the predefined color distribution emitted by the light source 116 determine the color point of the light emitted through the light exit window 102.

It is to be noted that the first light conversion element 112 may only consist of the inorganic luminescent material, for example, when a ceramic inorganic luminescent material is used, or the first inorganic material may be dispersed in a polymer (which is often termed a matrix polymer) or may be dispersed in another light transmitting material. The organic luminescent material of the second light conversion element 110 is often molecularly dissolved in the matrix polymer or in another material. The polymer matrix may be chosen amongst polymers such as acrylates (for example polymethylmethacrylate=PMMA), polycarbonate, polystyrene, polyethylene, polyethylene terepthalate, polyethylene naphtalate and their copolymers and blends. Further, in the drawing of FIG. 1a the cross-section of the first light conversion element 112 and the second light conversion element 110 is drawn as an elongated rectangle, which may be the cross-section of a rectangular layer, or a layer that is disk shaped, however, the shape of the conversion elements 110, 112 may differ from these shapes.

FIG. 1b shows a situation wherein the light source 116 is not operating, and ambient light 150 impinges on the light exit window 102 of the phosphor-enhanced lighting device 100 at a plurality of angles with respect to a normal to the light exit window 102. In a practical situation the ambient light 150 is relatively diffuse and light impinges at a plurality of angles at the light exit window. The ambient light 150 which impinges at relatively small angles with respect to the normal to the light exit window 102 is transmitted through the second light conversion element. The ambient light 150 which impinges at relatively large angles with respect o the normal to the light exit window 102 is reflected at an interface 152 between the second light conversion element 110 and the gap 111 and is, thus, not transmitted towards the first light conversion element 112. Hence, only a portion of the impinging ambient light 150 is transmitted to the first light conversion element 112. The inorganic luminescent material of the first light conversion element 112 absorbs some of the impinging ambient light 150 according to the absorption spectrum of the inorganic luminescent material. The non-absorbed light 154 is scattered and reflected back towards the light exit window 102. The non-absorbed light 154 does comprises less light in the absorption spectrum of the inorganic luminescent material of the first light conversion element 112 and, consequently, is experienced by the viewer 106 as light of a specific color. This specific color is the color appearance of the phosphor-enhanced lighting device 100 and the specific color is complementary to the color of the absorption spectrum of the inorganic luminescent material.

Hence, compared to phosphor-enhanced lighting device without the gap 111 between the first light conversion element 112 and the second light conversion element 110, the color appearance of the phosphor-enhanced lighting device of FIG. 1 is less, which means that less color is seen (thus, the saturation of the seen color is relatively low).

Figure 2A:
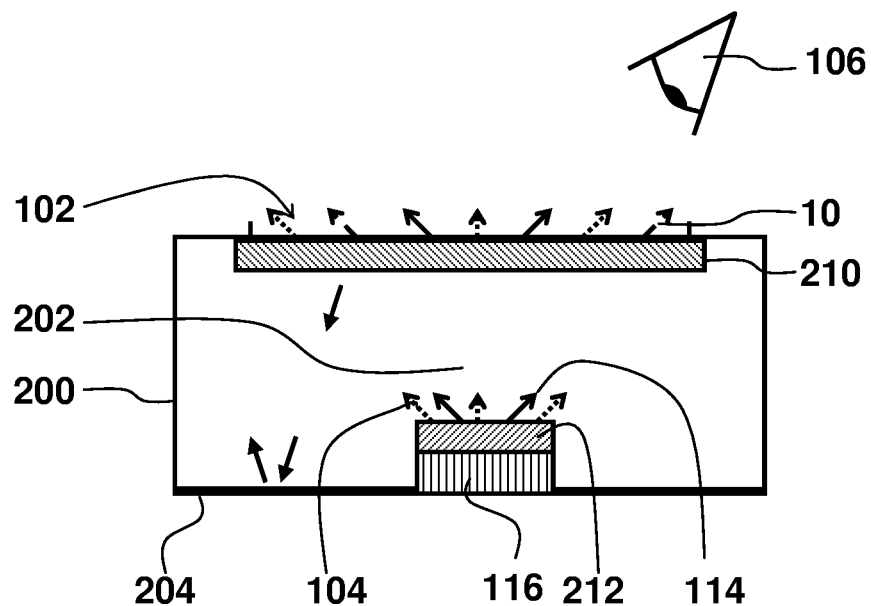

FIG. 2a presents another embodiment of a phosphor-enhanced lighting device 200. Compared to the phosphor-enhanced lighting device 100 of FIG. 1, the first light conversion element 212 is provided on the light emitting surface of the light source 116, and the second light conversion element 210 forms the light exit window of the phosphor-enhanced lighting device 200. The gap 202 between the first light conversion element 212 and the second light conversion element 210 is the cavity of the phosphor-enhance light source 200. The cavity is filled with a material that has a refractive index that is lower than the refractive index of the second light conversion element 210. Further, the inner surface 204 of the cavity, which is opposite the light exit window 102, is light reflective such that light which impinges on the inner surface 204 is reflected back to the light exit window and is recycled. The walls around the cavity may also be light reflective for the same purpose. Because the first light conversion element 212 is provided directly on top of the light emitting surface of the light source 116 it may have a relatively small size. Less light that impinges form the ambient can impinge on the first light conversion element and, thus, the color appearance of the phosphor-enhanced lighting device 200 is reduced.

Figure 2B:
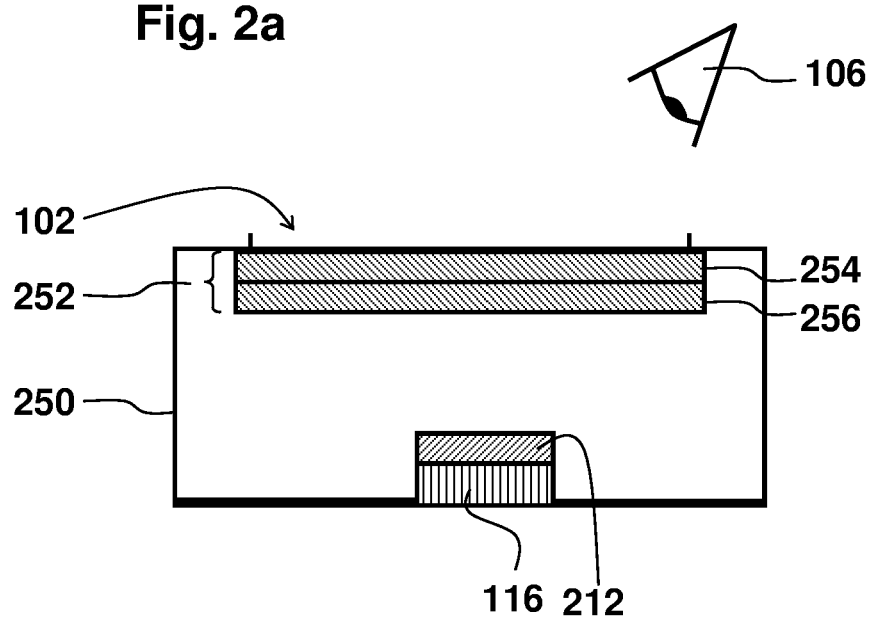

FIG. 2b presents a variant on of a phosphor-enhanced lighting device 250 which has a second light conversion element 252 which is manufactured as a stack of two layers. The first layer 254 of the stack of layers comprises a first organic luminescent material and the second layer 256 comprises a second organic luminescent material. The first organic luminescent material and the second luminescent material are different and convert light that is absorbed by the specific material to other colors. As such, if the phosphor-enhanced lighting device is in operation, an additional color is emitted through the light exit window into the ambient. This provides additional design freedom to design a phosphor-enhanced lighting device which emits light at a specific color point and has a relatively high color rendering index.

The first light conversion element 212 comprises an inorganic luminescent material. Examples of such materials are Ce doped YAG or LuAG. Ce doped YAG emits yellowish light, and Ce doped LuAg emits yellow-greenish light. Both materials have a relatively wide emission spectrum wherein the tail of the emission spectrum may even comprise wavelengths in the red spectral range. The second light conversion element 210, 252 comprise organic luminescent material which may be based on perylene derivatives. Examples of luminescent materials based on perylene derivatives are sold under the name Lumogen by BASF.

The specific combination of light source 116 and the first light conversion element 212, which is provided on top of the light emitting surface of the light source 116, may be a so-termed display Light Emitting Diode (LED). The light source 116 of display LEDs emit blue light and the first light conversion element 212 converts a relatively small portion of the blue light into yellow or yellow-green light. The resulting light emission, which is the combination of the blue light emitted by the light source, and the yellow or yellow-green light emitted by the inorganic luminescent material, has a color point in a color space that is close to a blackbody line of the color space and has a correlated color temperature that is higher than 10000 Kelvin. To obtain such a light emission, only a relatively thin layer of inorganic luminescent material needs to be used on top of the blue emitting LED, which results in a high optical efficiency. The thin layer of inorganic luminescent material does not reflect or scatter much blue light back to the LED and not much light of the yellow or yellow-green color is emitted towards the LED. LEDs in general do not reflect much of the light that impinges on them and as such most of the light that is reflected or scattered back to the LED or is emitted towards the LED results in an inefficiency of the combination of the LED and the inorganic luminescent layer. The optical package efficiency of the combination of the light source 116 and the first light conversion element 212 is larger than 80% and in another embodiment larger than 90%.

It is to be noted that, if two organic luminescent materials are used, they may also be mixed in one layer, such as, for example, in the layer of the second light conversion element 210 of FIG. 2a. In other embodiments, more than two organic luminescent materials are used which may be mixed in any combination in one layer or in a stack of layers with two or more layers.

Figure 3A:
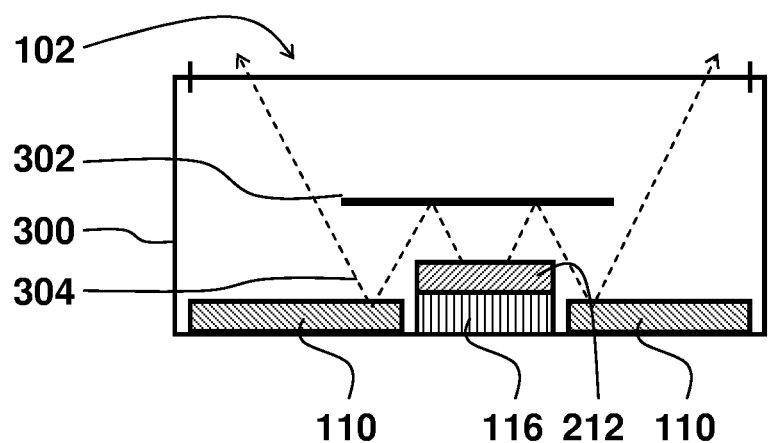
Figure 3B:
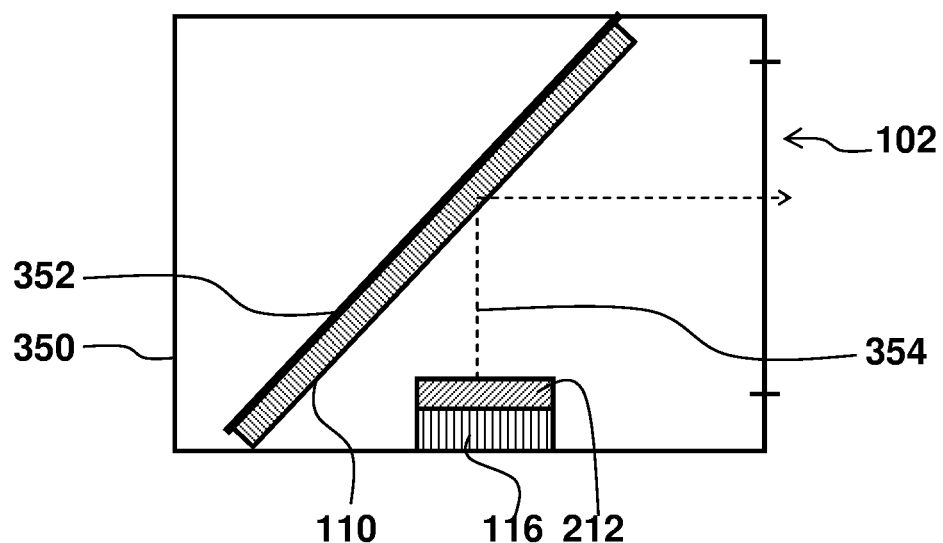

Cross-sections of phosphor-enhanced lighting devices which have a bended optical path 304, 354 from the light source 116 towards the light exit window 102 are presented in FIGS. 3a and 3b. At least one mirror 302, 352 is present in the optical paths 304, 354.

Phosphor-enhanced lighting device 300 has a mirror 302 arranged above a combination of the light source 116 and the first light conversion element 212. The mirror 302 reflects the received light towards the second light conversion elements 110 which are arranged on a base of the phosphor-enhanced lighting device 300 besides the light source 116. A back side of the second light conversion elements 110 is reflective such that the light which impinges on the second light conversion elements 110 and is generated within the second light conversion elements 110 is reflected towards the light exit window 102.

Phosphor-enhanced lighting device 350 has its light exit window 102 arranged at a side of the phosphor-enhanced lighting device 350. Within a cavity of the phosphor-enhanced lighting device 300 the mirror 352, which is coated with the second light conversion element 110, is arranged at a specific angle with respect to a base of the phosphor-enhanced lighting device on which the light source 116 is arranged.

Figure 4A:
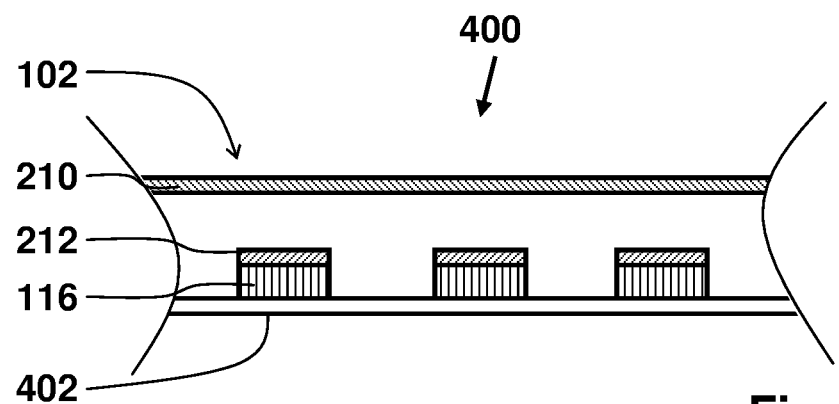

FIG. 4a schematically shows a cross-section of another embodiment of a phosphor-enhanced lighting device 400. A plurality of light sources 116 are provided on a base 402. On top of each of the light source 116 is provided the first light conversion element 212 which comprises an inorganic luminescent material. Further, at some distance away from the first light conversion element 212 is provided the second light conversion element 210 which comprises a first organic luminescent material. The second light conversion element 210 forms the light exit window 102 of the phosphor-enhanced lighting device 400. The phosphor-enhanced lighting device 400 further extends to the left and right.

Figure 4B:
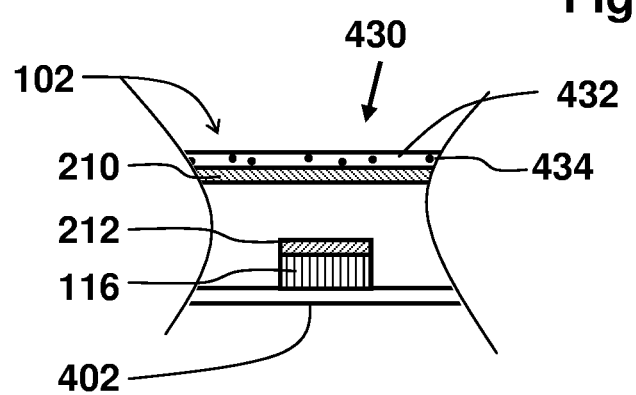

FIG. 4b schematically shows another variant of the phosphor-enhanced lighting device 430. On top of the second light conversion element 210 is provided a diffusion layer 432 with scattering particles 434. Scattering layer 432 forms the light exit window 102. The diffusion layer 432 provides a better color mixing and a diffuse light output. Further, if the light source 116 is not operating and if ambient light impinges on the scattering layer 432, the ambient light is scattered and reflected back to the ambient to a large extent. Thus, less ambient light impinges on the first light conversion element 212 and, consequently, the color appearance of the phosphor-enhanced lighting device 430 reduces. The diffusion layer may comprise scattering particles made of $TiO_2$ or $Al_2O_3$.

In this paragraph two examples are provided of a phosphor-enhanced lighting device which comprises a display Light Emitting Diode (LED) with a correlated color temperature of 20000K with a second light conversion element that is a stack of three layers. The display LED comprises a blue light emitting LED and a thin layer of Ce doped YAG or CE dopes LuAG on top of the light emitting surface of the display LED. In a first embodiment, the stack of three layers comprises at the side of the light exit window a 60 μm thick diffusing layer of PMMA which comprises 10 wt % $TiO_2$ particles. The middle layer is 27 μm thick and comprises 0.1 wt % Lumogen Yellow f170 (a prerylene derivative sold by BASF). The layer of the stack that is closest to the display LED is also 27 μm thick and comprises 0.025 wt % Lumogen Red f305. In a second embodiment, the stack of three layers comprises at the side of the light exit window a 60 μm thick diffusing layer of PMMA which comprises 10 wt % $TiO_2$ particles. The middle layer is 54 μm thick and comprises 0.1 wt % Lumogen Yellow f170 (a prerylene derivative sold by BASF). The layer of the stack that is closest to the display LED is also 27 μm thick and comprises 0.05 wt % Lumogen Red f305. The phosphor-enhanced lighting device with the first embodiment of the stack of three layers emits light at about 4000 Kelvin and has a color rending index (CRI) that is larger than 80. The phosphor-enhanced lighting device with the second embodiment of the stack of three layers emits light at about 3000 Kelvin and has a CRI that is larger than 80.

Figure 4C:
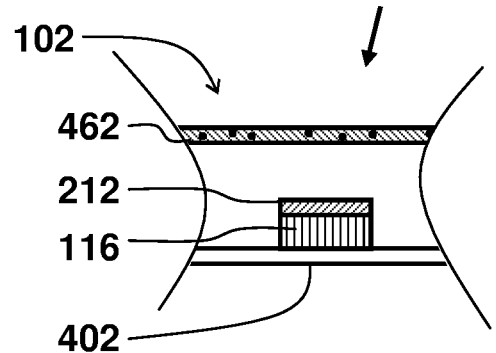

FIG. 4c schematically shows a cross-section of another phosphor-enhanced lighting device 460 which is slightly different from the phosphor-enhanced lighting device of FIG. 4b. The phosphor-enhanced lighting device 462 has scattering particles in the second light conversion element 462 instead of a separate layer with scattering particles.

Figure 5A:
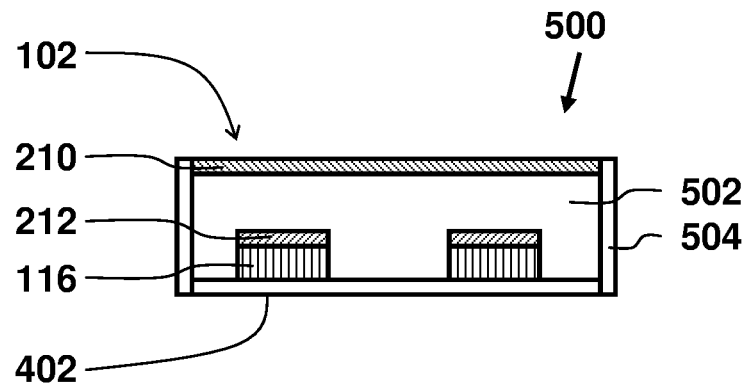
Figure 5B:
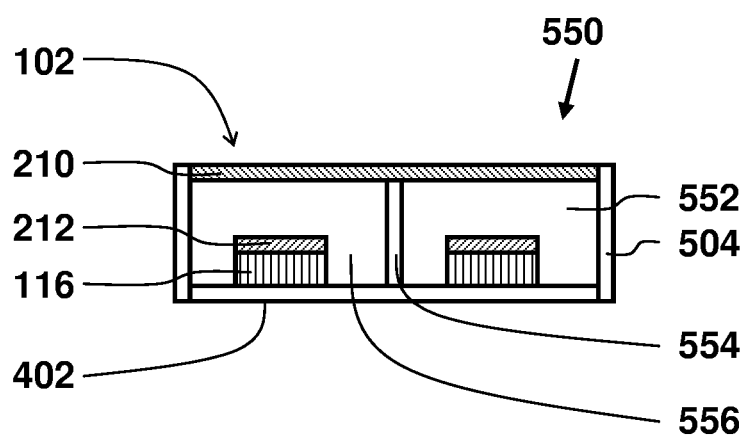

FIG. 5a schematically shows a cross-section of a further embodiment of a phosphor-enhanced lighting device 500. The phosphor-enhanced lighting device 500 is similar to the phosphor-enhanced lighting device 200 of FIG. 2a and the difference concerns the provision of more than one light source 116 with a first light conversion element 212 on top of the light emitting surface of the light source 116. FIG. 5b presents another phosphor-enhanced lighting device 550 which comprises walls 554 which are interposed in between the base 402 and the second light conversion element 210. The walls create around each light source 116 a separate cavity 556, 552.

Figure 6A:
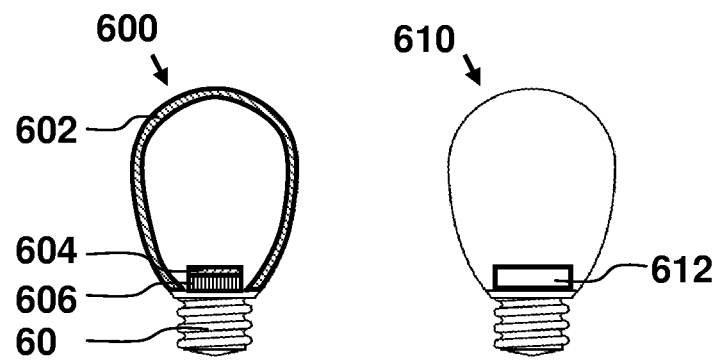

FIG. 6a presents cross-sections of retrofit light bulbs 600, 610 according to the second aspect of the invention. Retrofit light bulb 610 comprises a phosphor-enhanced lighting device 612 which is schematically drawn with a rectangle. The rectangle represents, for example, the box of phosphor-enhanced lighting device 200 of FIG. 2a. In another embodiment, a light source 606 is provided within a light bulb 600 and is provided on a base 608 of the light bulb 600. A first conversion element 604 is provided on top of the light emitting surface of the light source 606. The first light conversion element 604 comprises an inorganic luminescent material. The inner surface of the bulb is provided with the second light conversion element 602 which comprises a first organic luminescent material. The inorganic and the first organic luminescent materials have the same characteristics, functions and benefits as discussed in previous figures. The gap between the first light conversion element 604 and the second light conversion element 602 is formed by the inner space of the light bulb.

Figure 6B:
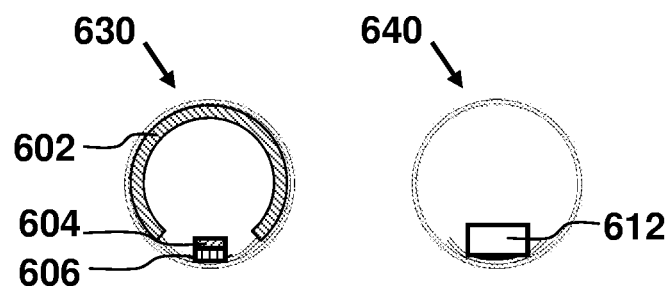

FIG. 6b presents cross-sections of two embodiments of a light tube 630, 640. The light tube 640 comprises, in the direction that follows the tube, a plurality of phosphor-enhanced lighting devices 612. Another embodiment of the light tube 630 comprises, in the direction that follows the tube, a plurality of light sources 606. A first light conversion element 604 is provided on top of each light source 606. The inner surface of the tube is provided with a second light conversion element 602. The first light conversion element 604 and the second light conversion element 606 have similar characteristics, benefits and functions as the first light conversion elements and second light conversion elements that are discussed in relation to previous figures.

Figure 6C:
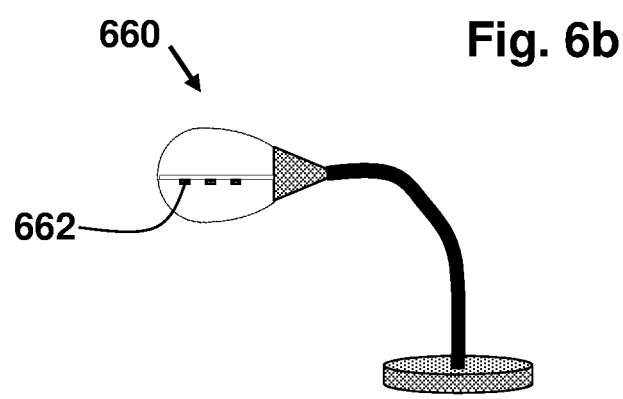

FIG. 6c presents a luminaire 660 which comprises one or more phosphor-enhanced lighting devices 662 according to the first aspect of the invention. In other embodiments, the luminaire may comprise a retrofit light bulb as discussed in the context of FIG. 6a, or may comprise a light tube as discussed in the context of FIG. 6b.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A phosphor-enhanced lighting device comprising:
a light source disposed on a base, the light source comprising a light emitting surface for emitting source light of a predefined color spectrum, a light exit window for emitting light into an ambient of the phosphor-enhanced lighting device,
a first light conversion element comprising an inorganic luminescent material, the inorganic luminescent material being configured to absorb a part of the source light and to convert a part of the absorbed light to light of a first color,
a second light conversion element extending in a first plane from a first end to a second end comprising a first organic luminescent material, the first organic luminescent material being configured to absorb a part of the source light or to absorb a part of the light of the first color, and the first organic luminescent material being configured to convert a part of absorbed lights to light of a second color,
wherein the second light conversion element is optically arranged in between the light exit window and a top light emitting surface of the light source, the first light conversion element is optically arranged in between the second light conversion element and the top light emitting surface of the light source and the first light conversion element is arranged directly on the top light emitting surface of the light source such that a bottom surface of the first light conversion element is in contact with the top light emitting surface of the light source, wherein the bottom surface of the first light conversion element extends only to a boundary of a perimeter of the top light emitting surface of the light source, and wherein a gap is between the first light conversion element and the second light conversion element.

2. The phosphor-enhanced lighting device according to claim 1, wherein the first light conversion has a first surface facing the light exit window, the second light conversion element has a second surface facing the light exit window, and the first surface is smaller than the second surface.

3. The phosphor-enhanced lighting device according to claim 1 wherein the light source is a blue light emitting light emitting diode, the inorganic luminescent material is a yellow or yellow-green emitting inorganic phosphor, and a light emission through the light exit window that is, in operation, a combination of source light and the light of the first color has a correlated color temperature that is higher than 10,000K and has a color point in a color space at about a black body line in the color space.

4. The phosphor-enhanced lighting device according to claim 1 wherein a combination of the light source with the light emitting surface on which the first light conversion element is arranged has an optical package efficiency that is larger than 80%, the optical package efficiency being defined by a percentage of all photons emitted by the light source which are emitted by the combination of the light source and the first light conversion element.

5. The phosphor-enhanced lighting device according to claim 1, wherein the second light conversion element has a second refractive index.

6. The phosphor-enhanced lighting device according to claim 1, wherein the second light conversion element is arranged at the light exit window or wherein the second light conversion element forms the light exit window.

7. The phosphor-enhanced lighting device according to claim 1, wherein the light source is a solid state light emitter.

8. The phosphor-enhanced lighting device according to claim 1, wherein at least one of the first light conversion element and the second light conversion element is a layer.

9. The phosphor-enhanced lighting device according to claim 1, wherein the second light conversion element comprises a second organic luminescent material, the second organic luminescent material being configured to absorb a part of the source light or to absorb a part of the light of the first color or to absorb a part of the light of the second color, and the second organic luminescent material being configured to convert a part of the absorbed light to light of a third color.

10. The phosphor-enhanced lighting device according to claim 9, wherein the second light conversion element is a stack of layers comprising a first layer and a second layer, the first layer comprising the first organic luminescent, material and not comprising the second organic luminescent material, and the second layer comprising the second organic luminescent material and not comprising the first organic luminescent material.

11. The phosphor-enhanced lighting device according to claim 1 comprising a scattering layer or the second light conversion element comprises scattering particles, wherein the scattering layer is optically arranged in between the light exit window and the second light conversion element.

12. A retrofit light bulb comprising the phosphor-enhanced lighting device according to claim 1.

13. A luminaire comprising the phosphor-enhanced lighting device according to claim 1.

14. The phosphor-enhanced lighting device according to claim 1, wherein the gap is filled with a fluid wherein the fluid is a liquid.

15. The phosphor-enhanced lighting device according to claim 1, further comprising one or more walls interposed between the base and the second light conversion element.

* * * * *